United States Patent [19]
Hanright

[11] Patent Number: 5,799,095
[45] Date of Patent: Aug. 25, 1998

[54] BESIDE-THE-DOOR PROGRAMMING SYSTEM FOR PROGRAMMING HEARING AIDS

[75] Inventor: William L. Hanright, Greenpond, N.J.

[73] Assignee: Siemens Hearing Instruments, Inc., Piscataway, N.J.

[21] Appl. No.: 640,372

[22] Filed: Apr. 30, 1996

[51] Int. Cl.$^6$ .................................................... H04R 25/00
[52] U.S. Cl. ............................ 381/68; 381/68.6; 381/69.2
[58] Field of Search ............................ 381/68, 68.2, 68.4, 381/68.6, 68.7, 69, 69.2, 60

[56] References Cited

U.S. PATENT DOCUMENTS 4,695,258 9/1987 Hanson et al. ............................ 439/67

FOREIGN PATENT DOCUMENTS

| 0 682 461 A2 | 11/1995 | European Pat. Off. . |
| 0 702 502 A1 | 3/1996 | European Pat. Off. . |
| 44 44586 C1 | 2/1996 | Germany . |

OTHER PUBLICATIONS

PCT International Search Report.

*Primary Examiner*—Huyen Le
*Attorney, Agent, or Firm*—Mark H. Jay

[57] ABSTRACT

A system for programming hearing aids uitilizes a multi-electrode programming strip. The strip is inserted into the aid through a narrow slot in the faceplate; the slot is bounded by the faceplate and by one of the edges of the battery door. When the door is closed, the strip (and the electrodes thereon) is urged against corresponding terminals that are located inside the aid.

11 Claims, 4 Drawing Sheets

U.S. Patent     Aug. 25, 1998     Sheet 1 of 4     5,799,095
FIG. 1
(PRIOR ART)
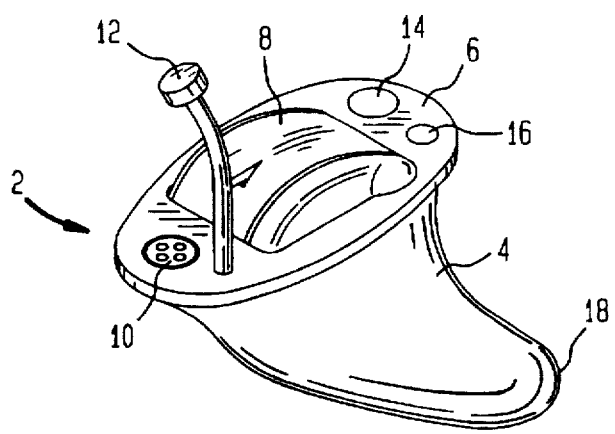
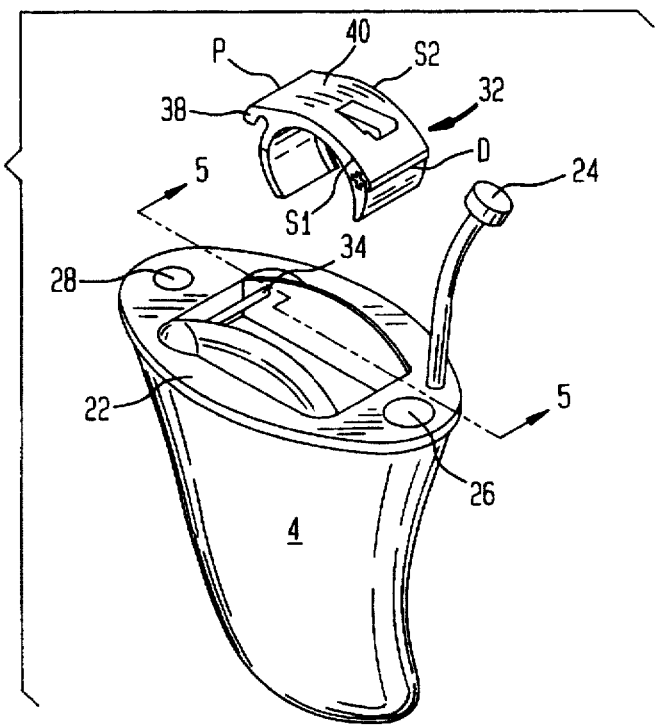
FIG. 2
FIG. 3
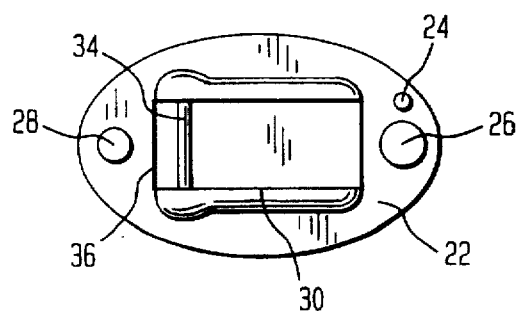
FIG. 4
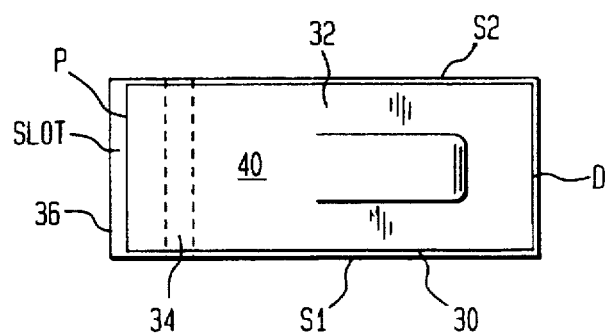

BESIDE-THE-DOOR PROGRAMMING SYSTEM FOR PROGRAMMING HEARING AIDS

BACKGROUND OF THE INVENTION

The invention relates to hearing aids, and more particularly relates to programmable hearing aids. In its most immediate sense, the invention relates to apparatus used to make an electrical connection between a programmable hearing aid and the programming unit used to program it.

A programmable hearing aid is a hearing aid in which certain characteristics of the aid (e.g. frequency response, attack and release times, AGC etc.) are adjustable by the hearing aid dispenser. Conventionally, such aids are programmed in situ, i.e. while they are in the patient's ear. This permits the patient and dispenser to check on the programming of the aid and to adjust the programming if the performance of the aid is substandard. In one class of programmable hearing aids, such as the InteliVenience line produced by Siemens Hearing Instruments, Inc., the aid is programmed by plugging a male portion of a connector into a corresponding female portion that is mounted to the faceplate of the hearing aid.

Such a connector is highly undesirable when used on small hearing aids such as CIC (completely-in-canal) aids. This is because CIC aids vary in size and shape; the housing of each CIC aid is custom molded to the shape of the patient's ear. With such variations in size and shape, there is no guarantee that the faceplate will have room for the connector or that the other faceplate-mounted components can be appropriately located on the faceplate if the connector is provided. By way of example, the faceplate of an InteliVenience CIC aid must provide room for a microphone port, a vent opening, a battery door and a retrieval line. Furthermore, the location of these elements is not a mere matter of choice: the microphone port should be located as far as possible from the vent opening to prevent feedback, and the battery door must be so located that it can be opened and closed.

It often happens that a particular InteliVenience aid cannot properly be provided with a programming option. This can happen when the shape of the user's ear makes it impossible to mount the female connector on the faceplate, and it can also happen when providing the connector on the faceplate would require the microphone to be located immediately adjacent to the vent. When this happens, the customer must be notified; if the customer is unwilling to accept an InteliVenience aid without the programming option, the order will be lost.

Furthermore, the female connector is difficult to install and to use. The female connector is difficult to install because it must be properly oriented with respect to the faceplate. This in turn comes about because the mating male connector has a 45° bend. If the female connector is not properly oriented with respect to the faceplate, the male connector will, during use, press against the interior of the user's ear. It is likewise difficult to use the female connector, because the male connector must be properly aligned for a connection to be established and the small sizes of the connectors makes it difficult to see whether the alignment between them is in fact proper. If the alignment is incorrect, it is relatively easy to damage the male connector, the female connector or both while trying to make an electrical connection between them.

Additionally, because the location of the female connector cannot be predicted in advance of the manufacturing process, production personnel must be capable of deciding e.g. a) whether there is enough room for the female connector on the faceplate, b) where the female connector should be located with respect to the other components that must be mounted on the faceplate, and c) the best way to wire the connector to the circuitry inside the aid. It is consequently necessary to employ highly skilled individuals to assemble the aid.

U.S. Pat. No. 4,961,230 relates to a programming system whereby the electrical connections necessary to program the aid are accessed through the door of the aid, thereby eliminating the need for a faceplate-mounted female connector. In this system, the dispenser removes the battery from the aid and inserts a programming "pill" that fits in the battery compartment. The dispenser then closes the door, places the aid in the user's ear, and programs the aid in situ.

While this system does away with the need for a female connector on the faceplate of the aid, it introduces disadvantages of its own. One such disadvantage is caused by the requirement that the cable connecting the programming pill with the programming unit be relatively thick.

In the system disclosed in U.S. Pat. No. 4,961,230 the battery is removed during the programming operation and power must be supplied through the cable. For this reason, and because modern hearing aids have many programmable functions, a cable for programming a modern CIC aid must contain four electrical conductors and the cable must be shielded against noise. Additionally, the cable must be mechanically robust to have the necessary durability, and for this reason also the cable must have a certain thickness. Because the cable is required to be relatively thick and because the cable must be able to exit the battery compartment with the battery door closed, the battery door cannot fit closely to the faceplate; sufficient clearance must exist so the cable can get out.

A loosely-fitting battery door is not only aesthetically unsatisfactory, but also seriously degrades the performance of the aid. This is because the opening between the door and the faceplate establishes an acoustic coupling with the microphone. This causes feedback.

This known system has other disadvantages as well. Because the programming pill and the cable are relatively bulky, they change the aural characteristics of the patient's outer ear. As a result, the patient's unaided hearing during programming of the aid is different from the patient's unaided hearing when the programming apparatus has been removed from the patient's ear. Furthermore, the power supply from the programming unit has different electrical characteristics from those of an installed battery, and the aid functions differently when powered by the programming unit.

It would be advantageous to provide a system for programming a programmable hearing aid that did not require a conventional female connector on the faceplate.

It would also be advantageous to provide such a system that required only a minimum clearance between the battery door and the faceplate.

It would likewise be advantageous to provide such a system in which it would be easy to make an electrical connection to the aid in order to program it.

It would further be advantageous to provide such a system that would permit the aid to be programmed using an installed battery as the power supply.

It would additionally be advantageous to provide such a system that would not require major modifications to the battery door and faceplate.

In accordance with the invention, a hearing aid programming system is provided. The system has two main parts. The first part, which is a part of the hearing aid itself, comprises a hearing aid housing, a faceplate attached to the housing, a programmable hearing aid circuit contained within the housing, a plurality of programming terminals electrically connected to the circuit and located inside the housing, and a battery door.

The faceplate has an opening for receiving the battery door. The door is hingedly connected to the faceplate so it is moveable between an open position and a closed position. The door has four edges, and one edge of the door is spaced apart from the faceplate so as to define a narrow slot bounded by said one edge and the faceplate. The slot is adjacent the programming terminals.

The other main part of the programming system is a multi-electrode programming strip. The strip is dimensioned to fit into the slot and has a like plurality of electrodes dimensioned to mate with the terminals. The door, strip and programming terminals are dimensioned to cooperate in a manner that when the strip has been fully inserted into the housing through the slot with the electrodes facing the terminals and the door is in the closed position, the electrodes are pressed against the terminals and make electrical contact therewith.

In accordance with the invention, the door is fitted as air-tightly as possible to the faceplate except along one of its edges. Along this edge, there is a slot; the slot is as narrow as possible to minimize acoustic coupling (and therefore feedback) when the slot is not filled by the programming strip during programming.

Advantageously, the slot is located at one of the ends of the door. By locating the slot and terminals adjacent an end of the door, the terminals are not mechanically stressed each time the battery is changed. This decreases the likelihood that the programming terminals will fail after prolonged use of the aid. In the preferred embodiment, the slot is located at the proximal end of the door. When so located, the preferred embodiment can utilize a conventional battery door.

In the preferred embodiment, the terminals are located on an interior surface of the faceplate. This makes it possible to implement the invention with only minor modifications to the faceplate.

In accordance with the invention, it is possible (although not required) to use the power of the battery during programming of the circuit. It is not necessary to connect the circuit to an external power supply. In accordance with the preferred embodiment, battery power is used during programming, and there are three terminals. Three terminals are used because this is convenient; with such a system, the aid can not only be programmed, but the programmed-in settings can be read from the outside.

Advantageously, the programming strip is a flexible printed circuit. Such circuits are commercially available in thicknesses of 3.8 mils or less. When such a flexible printed circuit is used as the programming strip, the slot can be as 4 mils wide, or even thinner. This reduces the extent of acoustic coupling, and therefore feedback, that the slot can create. In the preferred embodiment, the strip is so constructed that it will work properly regardless of the direction in which it has been inserted, making it impossible to damage the strip or the aid by improper insertion of the strip.

BRIEF DESCRIPTION OF THE DRAWING

The invention will be better understood with reference to the following illustrative and non-limiting drawings, in which:

FIG. 1 shows a conventional programmable CIC aid;

FIGS. 2, 3, 4, 5 and 6 show different views of that portion of the preferred embodiment of the invention which can be installed in a CIC aid;

DETAILED DESCRIPTION OF PREFERRED EMBODIMENTS

Figure 5:
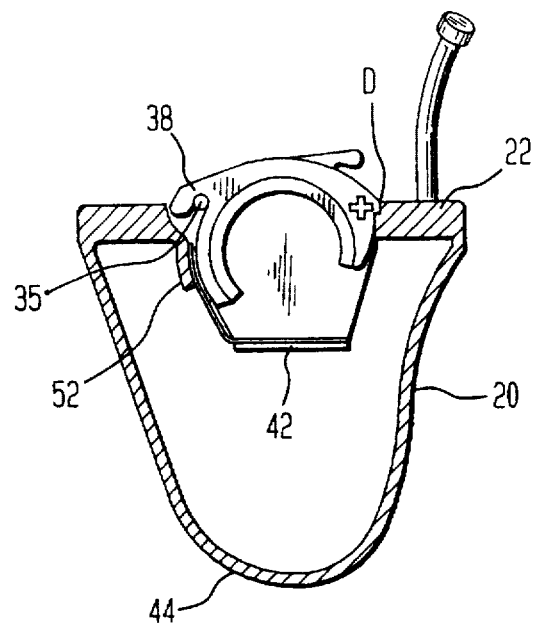

A conventional programmable CIC hearing aid 2 (FIG. 1) has a housing 4 and a faceplate 6. As shown, a battery door 8, a conventional female connector 10, a retrieval line 12, a microphone 14, and a vent 16 are located on the faceplate 6. As shown in FIG. 1, the size of the connector 10 is such that if it is installed in the aid 2, the microphone 14 is required to be immediately adjacent the vent 16. This is not appropriate because the vent 16 acoustically couples the microphone 14 to the receiver (not shown) at the medial tip 18 of the aid 2.

In accordance with the preferred embodiment of the invention as shown in FIGS. 2 and 3, a CIC hearing aid housing 20 is closed off by a faceplate 22. The faceplate 22 supports a retrieval line 24, a microphone 26, a vent 28, and a rectangular opening 30 (FIGS. 3 and 4). (The location of these elements is not a part of the invention. They may be located anywhere on the faceplate 22, as long as the microphone 26 is not located near the vent 28.) The opening 30 is shaped to mate with the battery door 32 described below, and is rectangular because conventional battery doors (e.g. door 32) fit into rectangular openings. However, it is possible to use an opening 30 of another shape.

The battery door generally indicated by reference numeral 32 is conventional, and is presently being provided with InteliVenience aids manufactured by Siemens Hearing Instruments, Inc., assignee hereof. As is known to persons skilled in the art, the battery door is so designed that it receives a hearing aid battery (not shown) and holds the battery in position as the battery door is opened and closed. When a battery is located in the battery door and the door is closed, the anode and cathode of the battery are urged against corresponding terminals (not shown) within the aid to provide power to the circuit 42 discussed below. Such terminals are conventional and will not be further discussed.

As is conventional in this art, to provide a hinge for the battery door 32, the faceplate 22 is provided with a metal pin 34 that is embedded at its ends in the faceplate 22. The pin 34 is adjacent one end 36 of the opening 30 (FIG. 4). The door 32 is provided with a snap-in clip 38 that snaps onto the pin 34 to hingedly secure the door 32 to the faceplate 22 and thereby allow the door 32 to be opened and closed.

The exterior surface 40 of the door 32 has four edges; two elongated sides S1 and S2, a proximal end P and a distal end D. In conventional fashion, mating regions on the faceplate 22 and the distal end D form a latch that keeps the door 32 latched when in the closed position. In accordance with the invention, the door 32 is dimensioned to have the closest possible fit within the opening 30, except along one of the edges S1, S2, P and D. Along this edge, the door 32 is slightly undersized, forming a slot that is bounded by the edge and by the opening 30. As will be described in more detail below, this slot is used as an access port into which a flexible programming strip 56 (see FIGS. 7A, 7B and 8) is inserted to program the aid.

In the preferred embodiment, this slot SLOT is bounded by the proximal end P of the door 32 and the end 36 of the opening 30. (See FIG. 4.) This makes it possible to use a completely conventional battery door 32. However, it is possible to locate the slot SLOT elsewhere around the door 32.

Advantageously, the slot SLOT is 4 mils wide, to accommodate a programming strip made of conventional 3.8 mil flexible printed circuit board. To achieve this thickness, it is necessary to make the faceplate 22, the pin 34 and the door 32 to very tight tolerances. However, in certain applications it may be possible to make the slot of a different width. The width of the slot is not a part of the invention.

Figure 6:
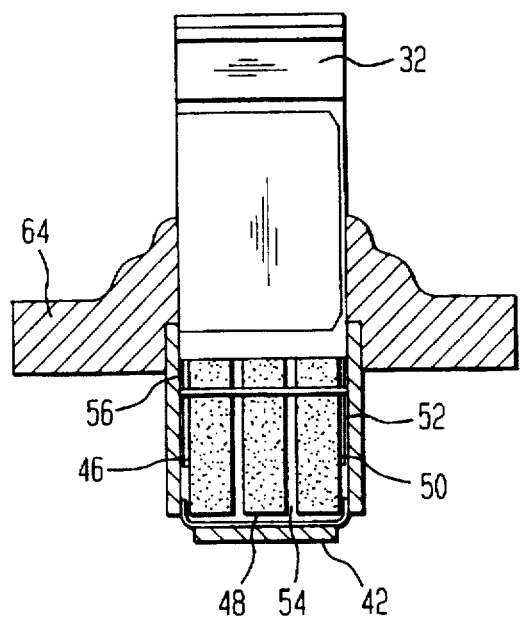

A programmable hearing aid circuit 42 (FIGS. 6, 9 and 10) is provided inside the housing 4. The circuit 42 is connected directly or indirectly to the microphone 26 and to the receiver (not shown) that is located in the medial tip 44 of the aid. In the preferred embodiment, the circuit 42 is so designed that with power supplied to the circuit 42 from the battery (not shown), three terminals 46, 48, 50 (see FIG. 6) are sufficient to program it and to read the settings that have been programmed into it. While this is preferred, it is not required; more or fewer terminals may be used instead.

The terminals 46, 48 and 50 are located on a support 52 that is integral with the faceplate 22. The support 52 is curved to follow the shape of the battery door 32 when the battery door 32 is in the closed position. Advantageously, the terminals 46, 48 and 50 are part of a flexible copper-Kapton printed circuit board 54 that is connected to the circuit 42, but this is not required. The terminals 46, 48, 50 may alternatively be individual components embedded in the support 52 and connected to the circuit 42 as by hard-wiring.

Figure 7A:
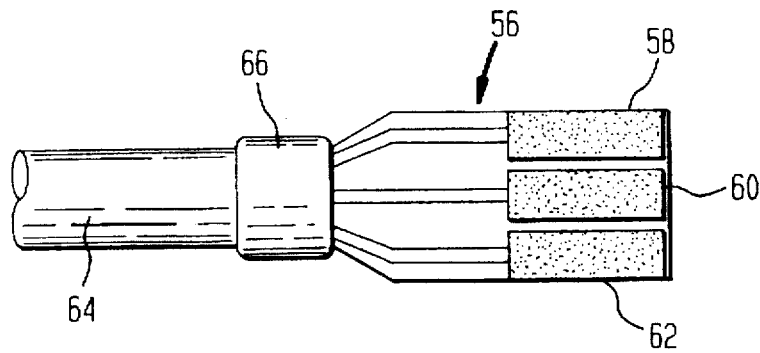
FIGS. 7A, 7B and 8 show different views of the programming strip used in the preferred embodiment of the invention.
Figure 8:
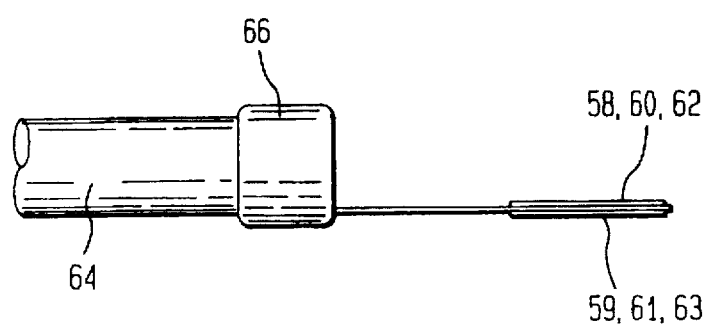
Figure 7B:
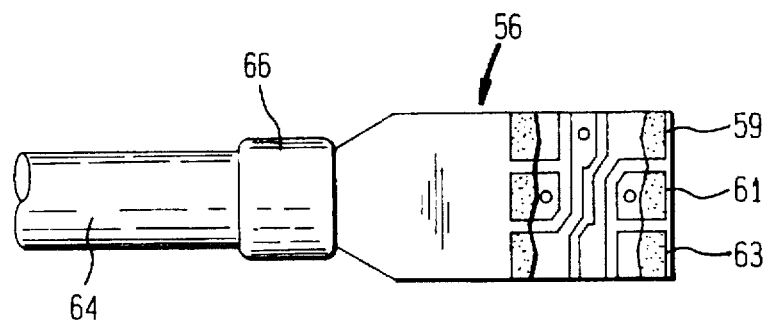

A programming strip 56 such as is illustrated in FIGS. 7A, 7B and 8 is used to program the aid 2. Advantageously, the strip 56 is flexible and 3.8 mils thick, and is formed using copper as the electrical conductor and Kapton as the substrate. As will be seen below, the strip 56 is designed so that it will operate properly regardless of the direction in which it is inserted into the slot SLOT. However, for clarity, the operation of the programming strip 56 will first be explained with reference to its three electrodes 58, 60 and 62.

The electrodes 58, 60 and 62 are dimensioned to mate with the terminals 46, 48 and 50 respectively. The electrodes 58, 60 and 62 are connected to an external programming unit (not shown) via a shielded cable 64 that is terminated by a collar 66. The programming unit provides electrical signals to the electrodes 58, 60 and 62, and when these electrodes 58, 60 and 62 are connected to the terminals 46, 48 and 50 and the battery is installed, these signals are used to program the circuit 42.

The strip 56 is dimensioned so as to just fit into the slot SLOT adjacent the battery door 32. If desired, the strip 56 may be ridged and the support 52 and printed circuit board 54 may be grooved to match. The strip 56 may also be thicker at its distal end than at its proximal end. Persons skilled in the art can adapt the shapes of the strip 56 and the support 52 to serve in whatever particular application is desired.

Figure 9:
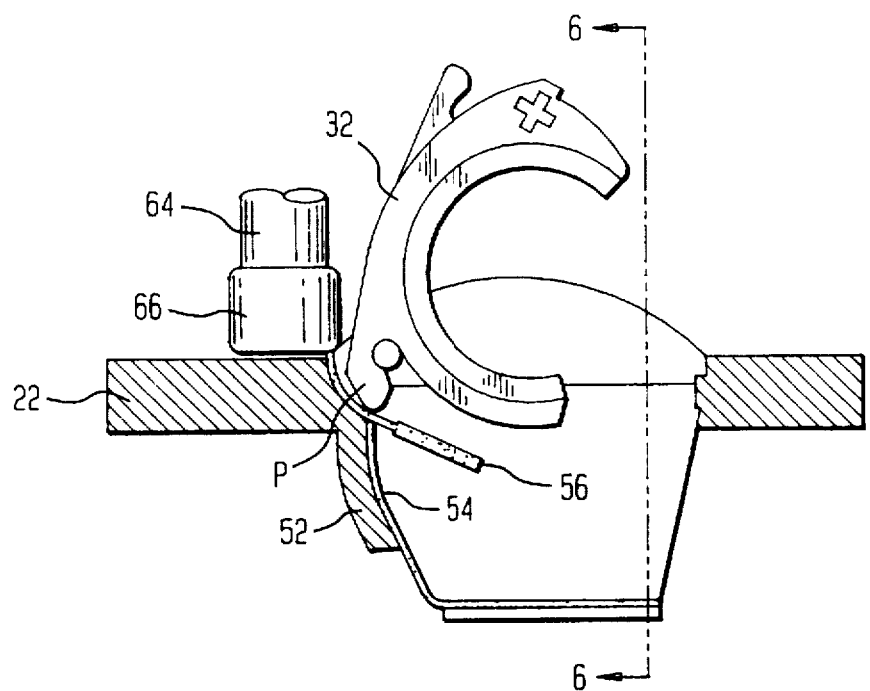
FIGS. 9 and 10 shows the programming strip inserted into the aid with the battery door open and closed respectively.
Figure 10:
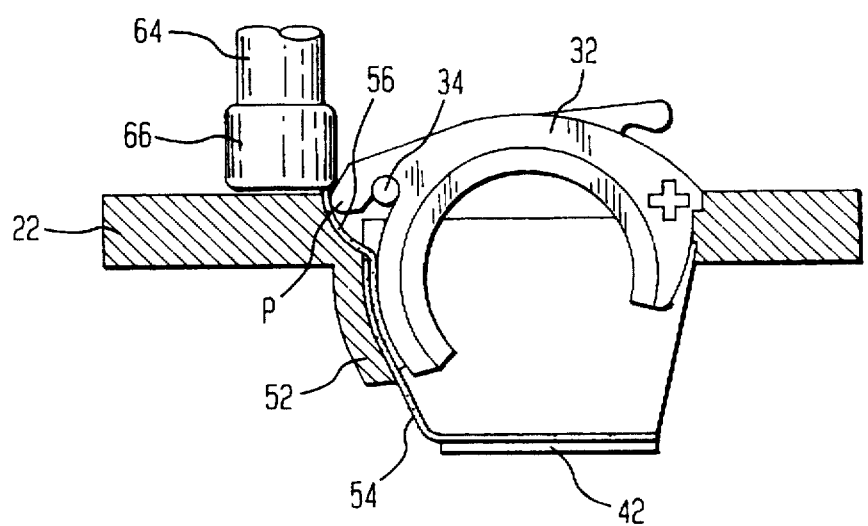

To program the aid 2, the door 32 is opened and a battery (not shown) is placed therein. The strip 56 is then inserted into the slot SLOT in such a manner that the electrodes 58, 60 and 62 face the terminals 46, 48 and 50. Insertion continues until the collar 66 strikes the faceplate 22 or other part of the aid; the collar 66 is deliberately chosen to be oversize with respect to the slot SLOT so that it serves as a stop to prevent over-insertion. As can be seen in FIG. 9, the flexed strip 56 is then suspended between the door 32 and the printed circuit board 54.

When the door 32 is closed, it presses the strip 56 against the printed circuit board 54 so that the electrodes 58, 60 and 62 make electrical contact with the terminals 46, 48 and 50 respectively. At the same time, the battery (not shown) is connected to the circuit 42. In this condition, the circuit 42 can be programmed by, or read by, the programming unit (not shown).

In the preferred embodiment, the strip 56 actually has electrodes on both sides. On the reverse side, the strip 56 has three electrodes 59, 61 and 63. The electrode 63 and the electrode 58 are connected to the same conductor in the cable 64, the electrode 62 and the electrode 59 are connected to the same conductor in the cable 64, and the electrodes 60 and 61 are also connected to the same conductor in the cable 64. By using this structure, it does not matter whether the strip 56 is inserted so that the electrodes 58, 60, 62 face the terminals 46, 48, 50, or whether the electrodes 59, 61, 63 face the terminals 46, 48, 50.

In the preferred embodiment, the strip 56 is advantageously inserted with the door 32 open. This is to minimize wear and physical stress on the strip 56, but it is not required. It would alternatively be possible to make strip 56 comparatively rigid and to e.g. supply springs that would urge the terminals 46, 48, 50 towards the door 32.

Although a preferred embodiment has been described above, the scope of the invention is limited only by the following claims:

I claim:

1. A hearing aid programming system, comprising:

a hearing aid housing;

a faceplate attached to the housing and having an opening for receiving a battery door;

a programmable hearing aid circuit contained inside the housing;

a plurality of programming terminals electrically connected to the circuit and located inside the housing;

the battery door located within the opening and being hingedly connected to the faceplate so as to be movable between open and closed positions, the door having four edges, one edge of the door being spaced apart from the faceplate so as to define a narrow slot bounded by said one edge and the faceplate, said slot being adjacent said programming terminals;

a multi-electrode programming strip dimensioned to fit into the slot, the strip having a plurality of electrodes dimensioned to mate with the terminals, the door, strip and terminals being dimensioned to cooperate in a manner that when the strip has been fully inserted into the housing through the slot with the electrodes facing the terminals and the door is in the closed position, the electrodes are pressed against the terminals and make electrical contact therewith.

2. The system of claim 1, wherein the strip is flexible.

3. The system of claim 2, wherein the strip is a flexible printed circuit board and the electrodes are printed thereon.

4. The system of claim 3, wherein there are two sets of electrodes, one set located on each side of the printed circuit board.

5. The system of claim 1, wherein there are three terminals.

6. The system of claim 1, wherein the strip is connected to an element that is too big to fit into the slot.

7. The system of claim 1, further comprising latch means for latching the door to the faceplate and thereby holding the door in the closed position.

8. The system of claim 1, wherein the housing is a completely-in-canal (CIC) housing.

9. The system of claim 1, wherein the terminals are located on a support that is integral with the faceplate.

10. The system of claim 1, wherein the door has a proximal end and a distal end and said one edge is at one of said ends of the door.

11. The system of claim 10, wherein said one edge is at the proximal end.

* * * * *